(12) United States Patent
Cho et al.

(10) Patent No.: US 9,640,474 B1
(45) Date of Patent: May 2, 2017

(54) POWER SEMICONDUCTOR PACKAGE HAVING POWER SEMICONDUCTOR DIE IN A SUPPORT SUBSTRATE WITH BAR VIAS

(71) Applicant: Infineon Technologies Americas Corp., El Segundo, CA (US)

(72) Inventors: Eung San Cho, Torrance, CA (US); Danny Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/052,520

(22) Filed: Feb. 24, 2016

(51) Int. Cl.
  *H01L 27/02* (2006.01)
  *H01L 23/498* (2006.01)
  *H01L 23/495* (2006.01)
  *H01L 21/48* (2006.01)
  *H01L 23/64* (2006.01)

(52) U.S. Cl.
  CPC ...... *H01L 23/49827* (2013.01); *H01L 21/486* (2013.01); *H01L 21/4821* (2013.01); *H01L 23/49575* (2013.01); *H01L 23/49861* (2013.01); *H01L 23/645* (2013.01)

(58) Field of Classification Search
  CPC ............ H03K 17/0412; H01F 27/2804; H01F 2017/0086; H01L 23/645; H01L 25/16; H01L 2224/16245; H01L 2924/1305; H01L 2924/13091; H01L 2924/18161; H01L 2924/00
  See application file for complete search history.

(56) References Cited

U.S. PATENT DOCUMENTS

2012/0299150 A1\* 11/2012 Tang ................ H01L 23/36
  257/531
2015/0091179 A1\* 4/2015 Shenoy ............... H01L 23/5381
  257/774

\* cited by examiner

*Primary Examiner* — Roy Potter
(74) *Attorney, Agent, or Firm* — Shumaker & Sieffert, P.A.

(57) ABSTRACT

A semiconductor package includes an output inductor placed over a support substrate, a power semiconductor die having a bottom surface situated on the support substrate and a top surface having an active region, where the output inductor is coupled to the active region on the top surface of the support substrate, and where the support substrate includes a plurality of bar vias. The output inductor is a packaged component having at least two leads in electrical connection with the active region of the power semiconductor die. The support substrate further includes routing conductors in electrical connection with the active region of the power semiconductor die. The power semiconductor die includes a control transistor and a sync transistor connected in a half-bridge.

19 Claims, 10 Drawing Sheets

Fig. 1

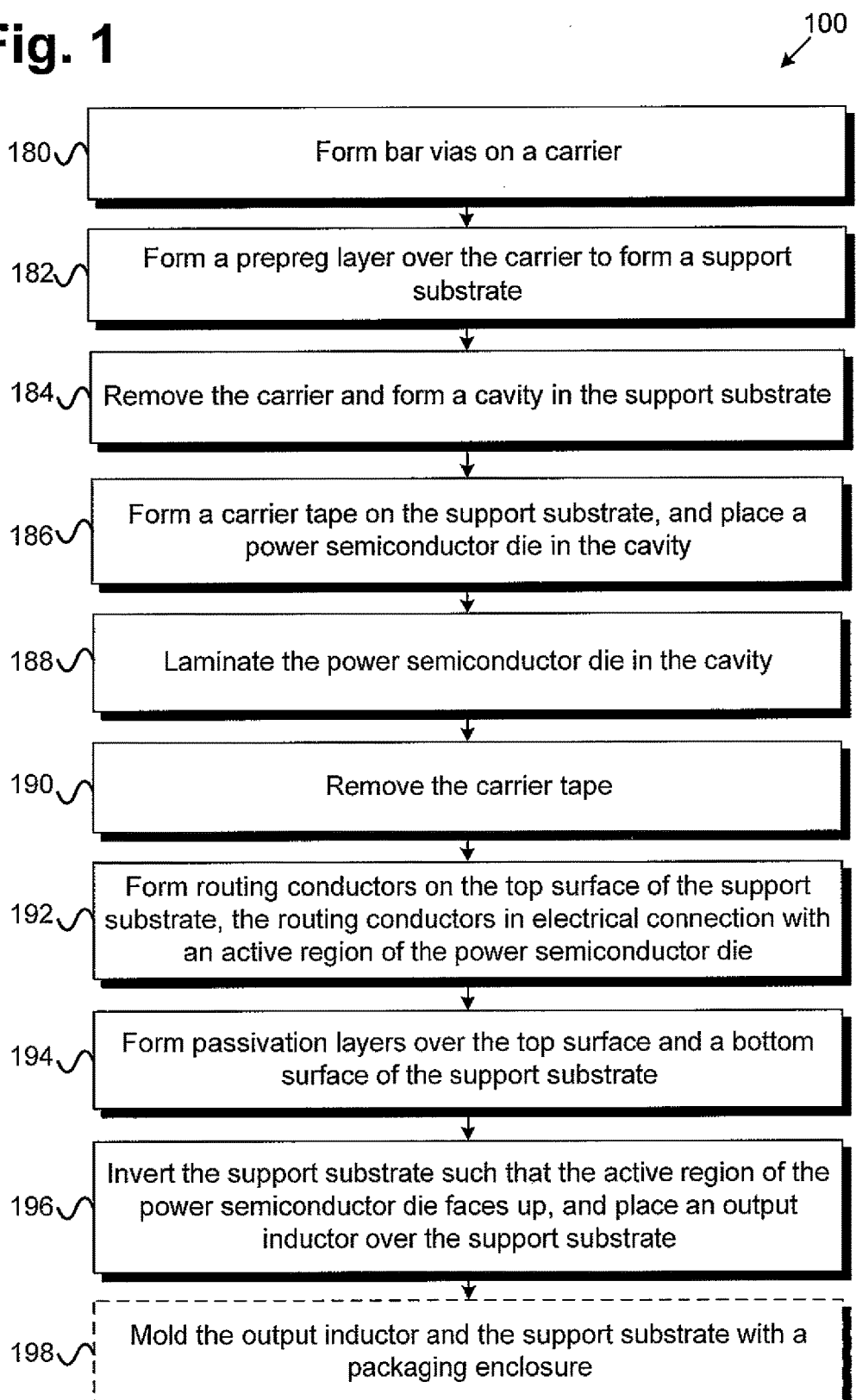

- 180 — Form bar vias on a carrier
- 182 — Form a prepreg layer over the carrier to form a support substrate
- 184 — Remove the carrier and form a cavity in the support substrate
- 186 — Form a carrier tape on the support substrate, and place a power semiconductor die in the cavity
- 188 — Laminate the power semiconductor die in the cavity
- 190 — Remove the carrier tape
- 192 — Form routing conductors on the top surface of the support substrate, the routing conductors in electrical connection with an active region of the power semiconductor die
- 194 — Form passivation layers over the top surface and a bottom surface of the support substrate
- 196 — Invert the support substrate such that the active region of the power semiconductor die faces up, and place an output inductor over the support substrate
- 198 — Mold the output inductor and the support substrate with a packaging enclosure

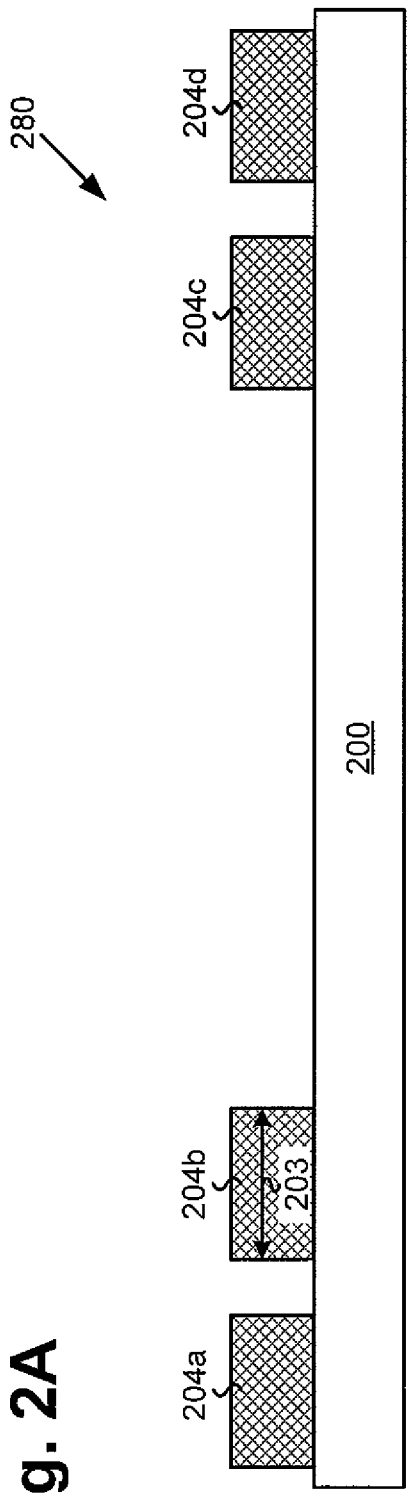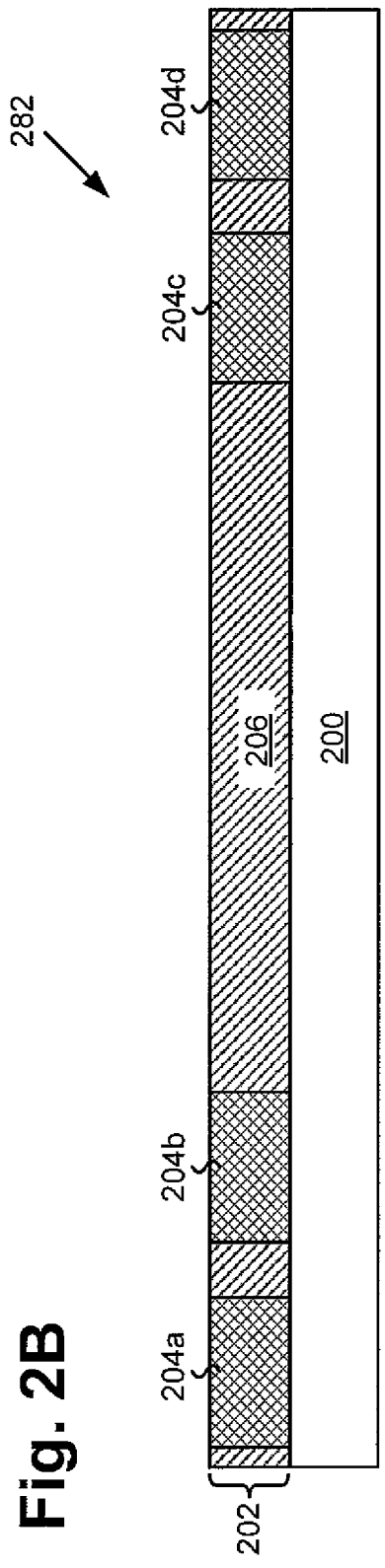

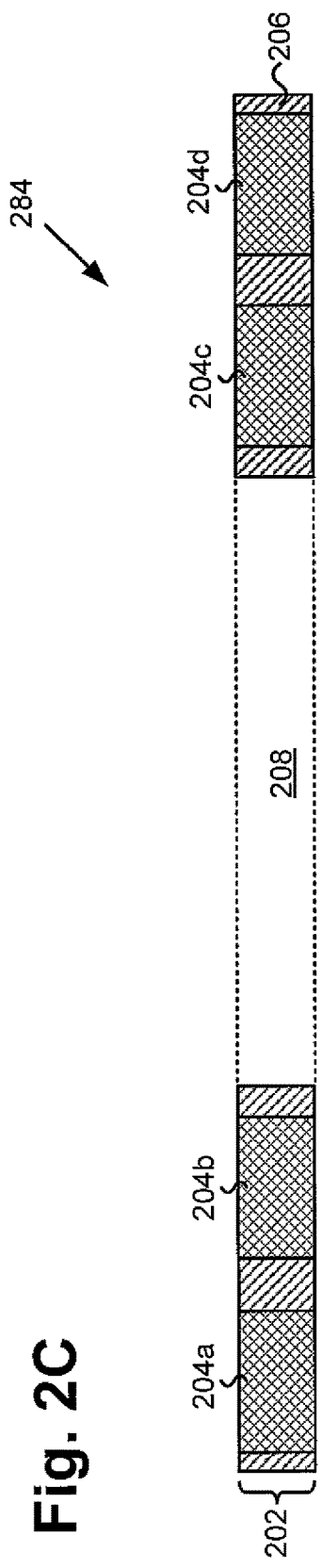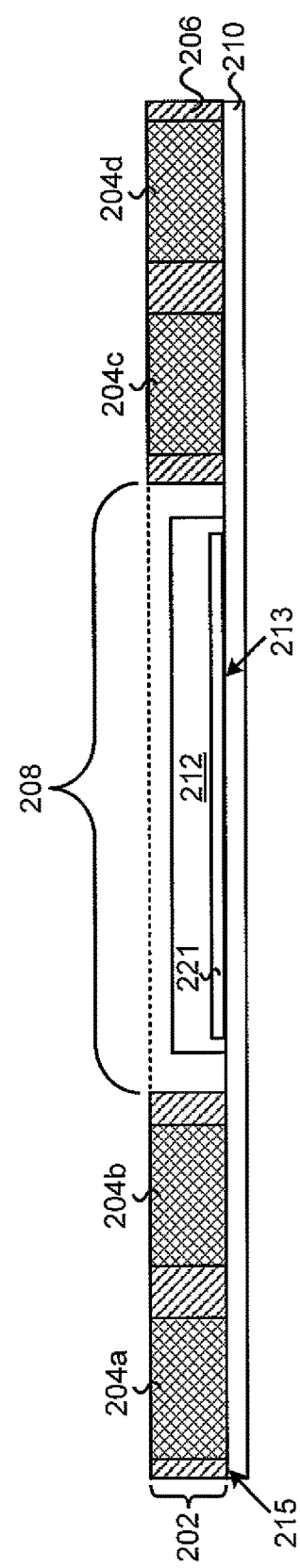

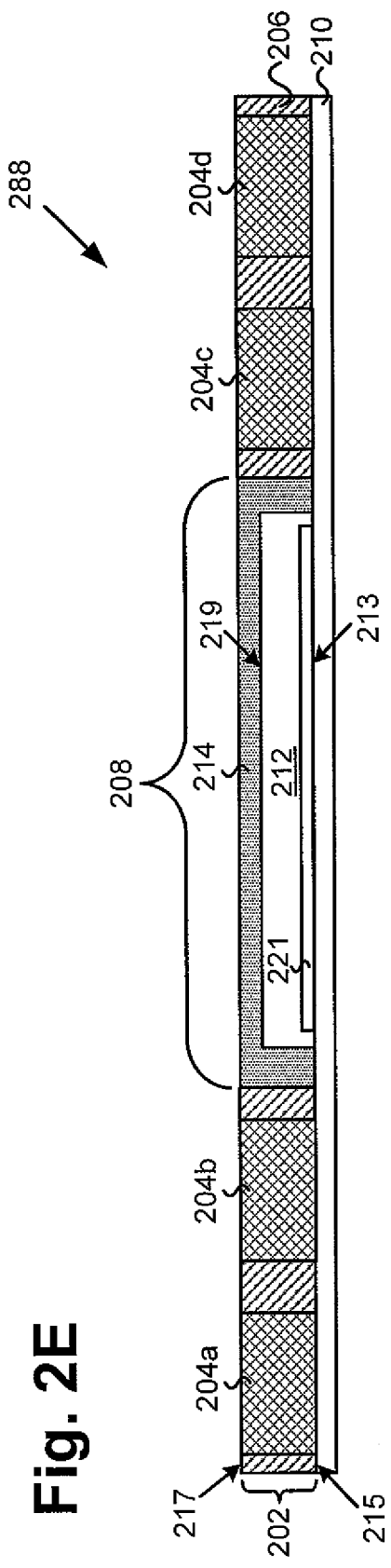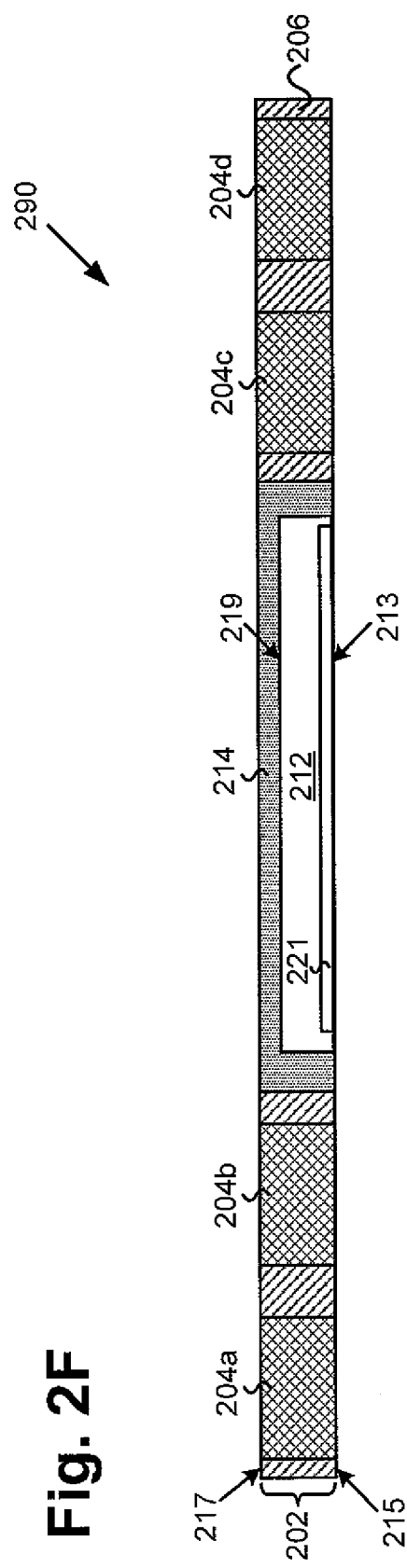
Fig. 2E
Fig. 2F

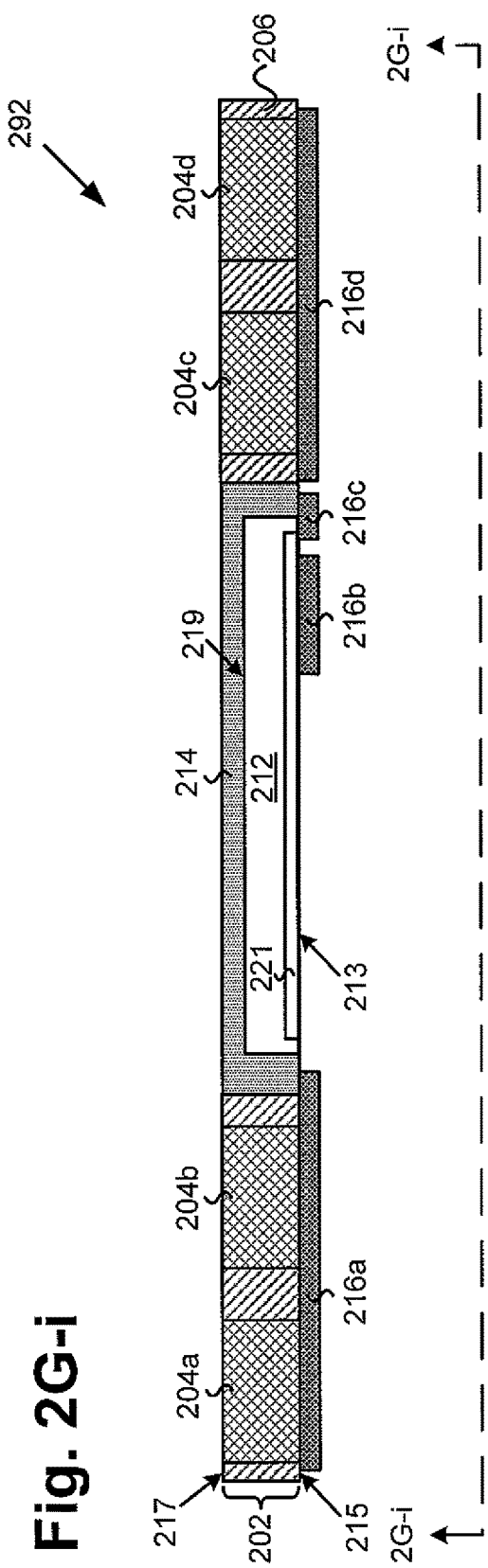

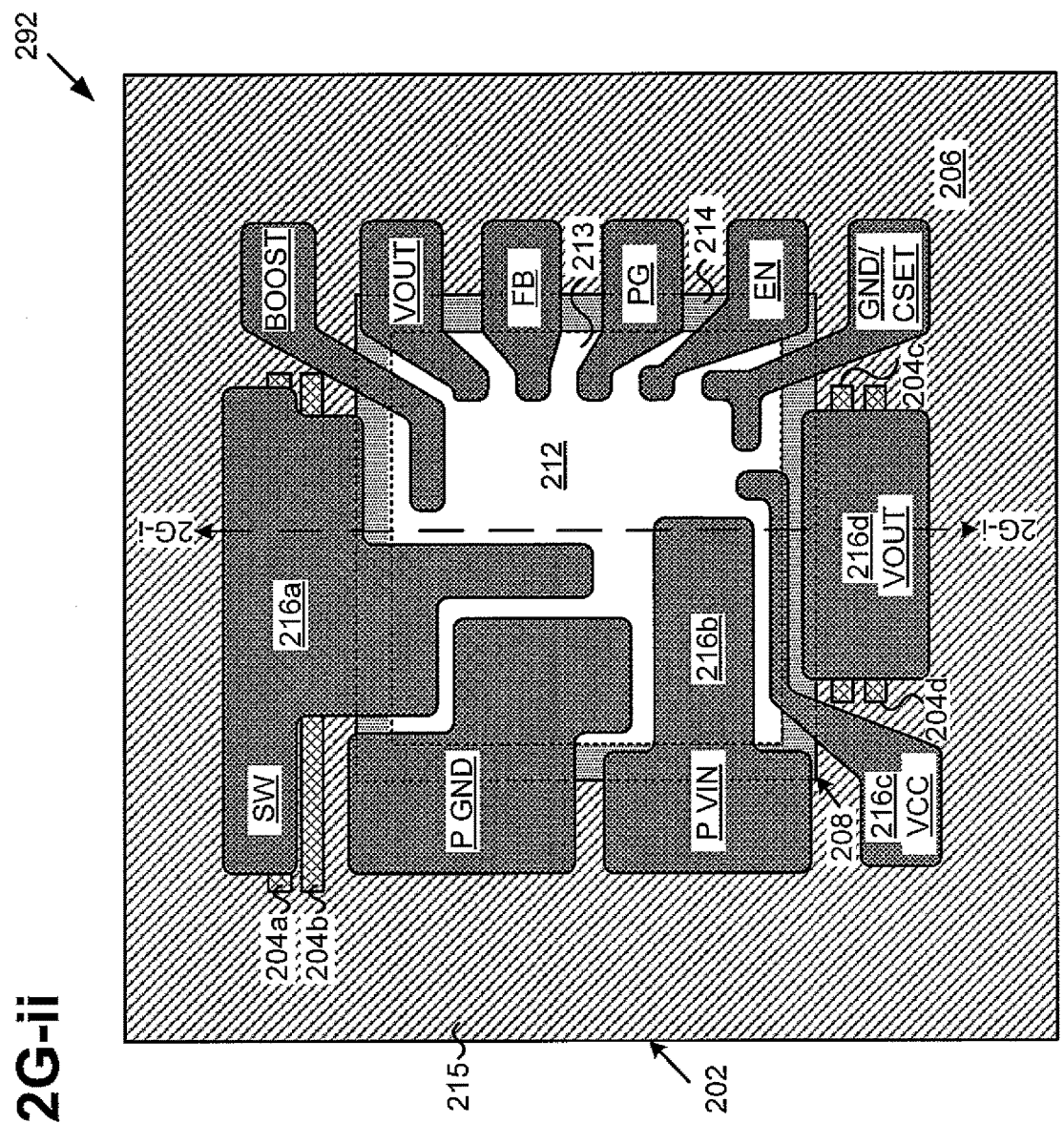
Fig. 2G-ii

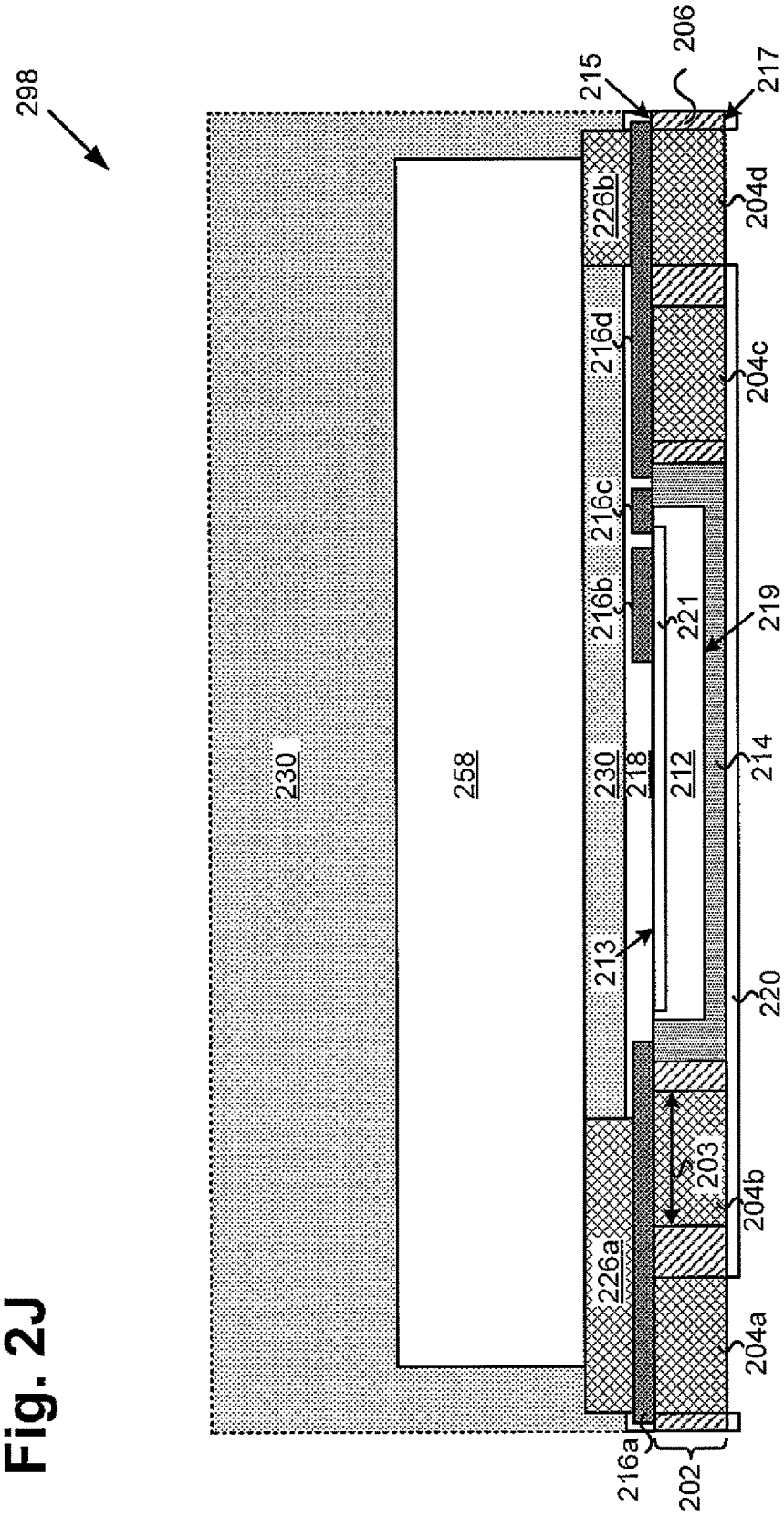

US 9,640,474 B1

POWER SEMICONDUCTOR PACKAGE HAVING POWER SEMICONDUCTOR DIE IN A SUPPORT SUBSTRATE WITH BAR VIAS

BACKGROUND

Power converters, such as point of load convertors, are used in a variety of electronic circuits and systems. For instance, integrated circuit (IC) applications may require conversion of a direct current (DC) input to a lower, or higher, DC output. As an example, a buck converter may be implemented as a voltage regulator to convert a higher voltage DC input to a lower voltage DC output for use in low voltage applications. Semiconductor packaging solutions for power converters may be configured to accommodate power transistors and an output inductor.

In a conventional power converter packaged assembly, a semiconductor device is embedded in a substrate, where an active region of the semiconductor device is faced down toward a printed circuit board. Because the active region of the semiconductor device is faced down in the substrate, it requires conductive vias and high precision alignment for the semiconductor device to make connections with one or more passive components over the substrate. Also, in the conventional power converter packaged assembly, laser vias are utilized to make connections between the active region of the semiconductor device and the one or more passive components over the substrate. Laser vias can be formed by making openings in the substrate using laser beams and filling the openings with conductive material. Laser vias, which typically have a diameter of 100 µm or less, have a limited current carrying capability. Moreover, the processes of embedding the semiconductor device facing down in the substrate and making laser via connections to the active region of the semiconductor device are both costly and time consuming.

Accordingly, there is a need to overcome the drawbacks and deficiencies in the art by providing a low cost power semiconductor package with enhanced thermal and electrical performances.

SUMMARY

The present disclosure is directed to a power semiconductor package having a power semiconductor die embedded in a support substrate with bar vias, substantially as shown in and/or described in connection with at least one of the figures, and as set forth in the claims.

BRIEF DESCRIPTION OF THE DRAWINGS

FIG. 1 is a flowchart illustrating a method of forming a power semiconductor package according to one implementation of the present application.

FIG. 2A illustrates a cross-sectional view of a portion of a power semiconductor package processed in accordance with an initial action in the flowchart of FIG. 1 according to one implementation of the present application.

FIG. 2B illustrates a cross-sectional view of a portion of a power semiconductor package processed in accordance with an intermediate action in the flowchart of FIG. 1 according to one implementation of the present application.

FIG. 2C illustrates a cross-sectional view of a portion of a power semiconductor package processed in accordance with an intermediate action in the flowchart of FIG. 1 according to one implementation of the present application.

FIG. 2D illustrates a cross-sectional view of a portion of a power semiconductor package processed in accordance with an intermediate action in the flowchart of FIG. 1 according to one implementation of the present application.

FIG. 2E illustrates a cross-sectional view of a portion of a power semiconductor package processed in accordance with an intermediate action in the flowchart of FIG. 1 according to one implementation of the present application.

FIG. 2F illustrates a cross-sectional view of a portion of a power semiconductor package processed in accordance with an intermediate action in the flowchart of FIG. 1 according to one implementation of the present application.

FIG. 2G-i illustrates a cross-sectional view of a portion of a power semiconductor package processed in accordance with an intermediate action in the flowchart of FIG. 1 according to one implementation of the present application.

FIG. 2G-ii illustrates a top plan view of a portion of a power semiconductor package processed in accordance with an intermediate action in the flowchart of FIG. 1 according to one implementation of the present application.

FIG. 2H illustrates a cross-sectional view of a portion of a power semiconductor package processed in accordance with an intermediate action in the flowchart of FIG. 1 according to one implementation of the present application.

FIG. 2I illustrates a cross-sectional view of a portion of a power semiconductor package processed in accordance with an intermediate action in the flowchart of FIG. 1 according to one implementation of the present application.

FIG. 2J illustrates a cross-sectional view of a portion of a power semiconductor package processed in accordance with a final action in the flowchart of FIG. 1 according to one implementation of the present application.

DETAILED DESCRIPTION

Figure 2H:
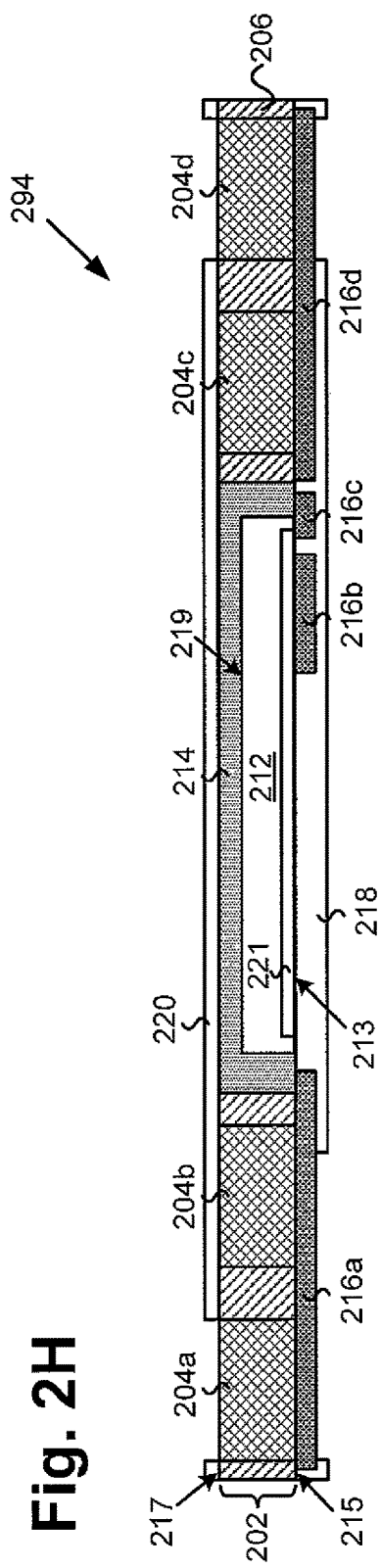

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method of forming an exemplary power semiconductor package according to an implementation of the present application. Certain details and features have been left out of the flowchart that are apparent to a person of ordinary skill in the art. For example, an action may consist of one or more subactions or may involve specialized equipment or materials, as known in the art. Actions 180, 182, 184, 186, 188, 190, 192, 194, 196 and 198 indicated in flowchart 100 are sufficient to describe one implementation of the present inventive concepts, other implementations of the present inventive concepts may utilize actions different from those shown in flowchart 100. Moreover, semiconductor structures 280, 282, 284, 286, 288, 290, 292, 294, 296 and 298 in FIGS. 2A, 2B, 2C, 2D, 2E, 2F, 2G-i, 2G-ii, 2H, 2I and 2J illustrate the results of performing actions 180, 182, 184,

186, 188, 190, 192, 194, 196 and 198 of flowchart 100, respectively. For example, semiconductor structure 280 is an exemplary structure of a portion of a power semiconductor package after processing action 180, semiconductor structure 282 is an exemplary structure of a portion of a power semiconductor package after the processing of action 182, semiconductor structure 284 is an exemplary structure of a portion of a power semiconductor package after the processing of action 184, and so forth.

Referring to action 180 in FIG. 1 and semiconductor structure 280 in FIG. 2A, action 180 includes forming bar vias on a carrier. Referring to FIG. 2A, semiconductor structure 280 illustrates a cross-sectional view of a portion of a power semiconductor package after completion of action 180 in flowchart 100 of FIG. 1, according to one implementation of the present disclosure. As illustrated in FIG. 2A, semiconductor structure 280 includes bar vias 204a, 204b, 204c and 204d on carrier 200.

In the present implementation, bar vias 204a, 204b, 204c and 204d may include or may be made of a suitable conductive material such as aluminum (Al), copper (Cu), nickel (Ni), aluminum (Al), titanium (Ti), tungsten (W), or a stack and/or an alloy including one or more of the aforementioned materials. In the present implementation, bar vias 204a, 204b, 204c and 204d may be formed by plating a conductive material on a top surface of carrier 200. Carrier 200 may be any suitable carrier board, such as a foil carrier, a glass carrier or a glue stack.

As illustrated in FIG. 2A, bar vias 204a, 204b, 204c and 204d may have substantially the same dimensions (e.g., width, length and height). In the present implementation, width 203 is equal to or greater than 150 μm (i.e., $150*10^{-6}$ meters). In contrast to power converter packaged assemblies having laser vias with diameters of less than or equal to 100 μm, bar vias 204a, 204b, 204c and 204d are pre-formed bar vias, and can each provide a greater current carrying capability and a lower resistance. Bar vias 204a, 204b, 204c also enable wide connection interfaces and easy connectivity to electrical connectors or routing structures on both top and bottom surfaces thereof.

Referring to action 182 in FIG. 1 and semiconductor structure 282 in FIG. 2B, action 182 includes forming a pre-impregnated (hereinafter "prepreg") layer over the carrier to form a support substrate. Referring to FIG. 2B, semiconductor structure 282 illustrates a cross-sectional view of a portion of a power semiconductor package after completion of action 182 in flowchart 100 of FIG. 1, according to one implementation of the present disclosure. As illustrated in FIG. 2B, semiconductor structure 282 includes support substrate 202 having prepreg layer 206 with bar vias 204a, 204b, 204c and 204d formed therein.

As illustrated in FIG. 2B, prepreg layer 206 is situated over carrier 200 and occupies the spaces between bar vias 204a, 204b, 204c and 204d. In the present implementation, prepreg layer 206 is a general glass-fabric-base material prepreg. In one implementation, prepreg layer 206 may include standard flow prepreg, such as fiberglass or other fabric, which has been saturated with polymer resin and partially cured. In another implementation, prepreg layer 206 may include no-flow or low flow prepreg. Prepreg layer 206 may be formed as a blanket layer over carrier 200. Thereafter, the excess portions of prepreg layer 206 over bar vias 204a, 204b, 204c and 204d may be removed, for example, by chemical mechanical polishing (CMP) to expose the respective contact surfaces of bar vias 204a, 204b, 204c and 204d. As can be seen in FIG. 2B, prepreg layer 206 is coplanar with bar vias 204a, 204b, 204c and 204d. As a result, support substrate 202 is formed, where support substrate 202 includes prepreg layer 206 having bar vias 204a, 204b, 204c and 204d formed therein. In contrast to power converter packaged assemblies where laser vias are formed in a substrate (thus after the substrate formation), bar vias 204a, 204b, 204c and 204d are formed on carrier 200 prior to the formation of prepreg layer 206. Thus, the locations and dimensions of bar vias 204a, 204b, 204c and 204d can be well controlled.

Referring to action 184 in FIG. 1 and semiconductor structure 284 in FIG. 2C, action 184 includes removing the carrier and forming a cavity in the support substrate. Referring to FIG. 2C, semiconductor structure 284 illustrates a cross-sectional view of a portion of a power semiconductor package after completion of action 184 in flowchart 100 of FIG. 1, according to one implementation of the present disclosure. As illustrated in FIG. 2C, semiconductor structure 284 includes cavity 208 in support substrate 202. It is noted that carrier 200 in semiconductor structure 282 is removed before cavity 208 is formed in support substrate 202. In one implementation, cavity 208 may be formed by punching a hole through support substrate 202. It should be noted that although support substrate 202 appears to be severed by cavity 208, support substrate 202 is actually connected on the peripheral edges thereof, when seen from a top plan view (not explicitly shown in FIG. 2C). As illustrated in FIG. 2C, bar vias 204a and 204b and bar vias 204c and 204d are situated on opposing sides of support substrate 202, and separated by cavity 208.

Referring to action 186 in FIG. 1 and semiconductor structure 286 in FIG. 2D, action 186 includes forming a carrier tape on the support substrate, and placing a power semiconductor die in the cavity. Referring to FIG. 2D, semiconductor structure 286 illustrates a cross-sectional view of a portion of a power semiconductor package after completion of action 186 in flowchart 100 of FIG. 1, according to one implementation of the present disclosure. As illustrated in FIG. 2D, semiconductor structure 286 includes power semiconductor die 212 and support substrate 202 on carrier tape 210.

As illustrated in FIG. 2D, carrier tape 210 is attached to top surface 215 of support substrate 202. Carrier tape 210 may include any suitable carrier tape, such as a glass film, a metal film or a resin film. Thereafter, power semiconductor die 212 is placed on carrier tape 210 in cavity 208 in support substrate 202. Power semiconductor die 212 includes active region 221 on or near top surface 213. It is noted that top surface 213 of power semiconductor die 212 is placed face down on carrier tape 210. As will be explained with reference to action 196 of flowchart 100 in FIG. 1 and semiconductor structure 296 in FIG. 2I below, top surface 213 of power semiconductor die 212 and top surface 215 of support substrate 202 will be subsequently inverted in action 196, such that top surface 213 of power semiconductor die 212 and top surface 215 of support substrate 202 will face upward. Thus, although top surface 213 of power semiconductor die 212 and top surface 215 of support substrate 202 appear to be facing down and in contact with the top surface of carrier tape 210 in semiconductor structure 286 in FIG. 2D, top surface 213 of power semiconductor die 212 and top surface 215 of support substrate 202 will eventually become the respective top surfaces of power semiconductor die 212 and support substrate 202.

As illustrated in FIG. 2D, top surface 213 of power semiconductor die 212 is placed face down on carrier tape 210. Power semiconductor die 212 includes active region 221 on or near top surface 213. Top surface 213 may include one or more electrode pads (not explicitly shown in FIG. 2D) thereon. In the present implementation, power semiconductor die 212 may include a power stage (not explicitly shown in FIG. 2D). Power semiconductor die 212 may include a high side or control transistor (e.g., a control transistor) coupled to a low side or sync transistor (e.g., a sync transistor) at a switched node. Power semiconductor die 212 may also include a PWM control and driver coupled to the control transistor and the sync transistor. In an implementation, the PWM control and driver may be implemented as a PWM and control driver IC ("integrated circuit"), and is configured to provide drive signals to the respective gates of the control transistor and the sync transistor. In an implementation, the power stage, having the control transistor and the sync transistor, is monolithically integrated on power semiconductor die 212. It is noted that the PWM control and driver, the control transistor and the sync transistor are not explicitly shown in FIG. 2D, but may be monolithically integrated on power semiconductor die 212 in any suitable method and/or manner known in the art.

In the present implementation, power semiconductor die 212 may include group IV material, such as silicon. In another implementation, power semiconductor die 212 may include group III-V material, such as gallium nitride (GaN). In some implementations, it may be advantageous or desirable for at least one of the control transistor and the sync transistor to be implemented as a group III-V power transistor, such as a GaN power transistor, for example.

Referring to action 188 in FIG. 1 and semiconductor structure 288 in FIG. 2E, action 188 includes laminating the power semiconductor die in the cavity. Referring to FIG. 2E, semiconductor structure 288 illustrates a cross-sectional view of a portion of a power semiconductor package after completion of action 188 in flowchart 100 of FIG. 1, according to one implementation of the present disclosure. As illustrated in FIG. 2E, semiconductor structure 288 includes laminating layer 214 in cavity 208 of support substrate 202 over carrier tape 210. In the present implementation, laminating layer 214 may include any suitable material, such as resin material. Laminating layer 214 may be formed as a blanket layer on bottom surface 217 of support substrate 202 and in cavity 208. Thereafter, excess portions of laminating layer 214 may be removed, for example, by chemical mechanical polishing (CMP) to expose the respective contact surfaces of bar vias 204a, 204b, 204c and 204d, and bottom surface 217 of support substrate 202. As can be seen in FIG. 2E, laminating layer 214 in cavity 208 is coplanar with prepreg layer 206 and bar vias 204a, 204b, 204c and 204d, where bar vias 204a, 204b, 204c and 204d are each exposed on their respective contact surfaces. Laminating layer 214 fills in cavity 208 and on bottom surface 219 of power semiconductor die 212 and the sidewalls thereof. As a result, power semiconductor die 212 is embedded in support substrate 202. As illustrated in FIG. 2E, active region 221 on or near top surface 213 of power semiconductor die 212 faces down on carrier tape 210.

Referring to action 190 in FIG. 1 and semiconductor structure 290 in FIG. 2F, action 190 includes removing the carrier tape. Referring to FIG. 2F, semiconductor structure 290 illustrates a cross-sectional view of a portion of a power semiconductor package after completion of action 190 in flowchart 100 of FIG. 1, according to one implementation of the present disclosure. As illustrated in FIG. 2F, semiconductor structure 290 includes support substrate 202, where carrier tape 210 in semiconductor structure 288 in FIG. 2E is removed. Carrier tape 210 may be removed by any suitable method known in the art. As illustrated in FIG. 2F, after the removal of carrier tape 210, top surface 213 of power semiconductor die 212 and top surface 215 of support substrate 202 are coplanar and exposed. Also, bar vias 204a, 204b, 204c and 204d are exposed on their respective top and bottom contact surfaces.

Figure 2I:
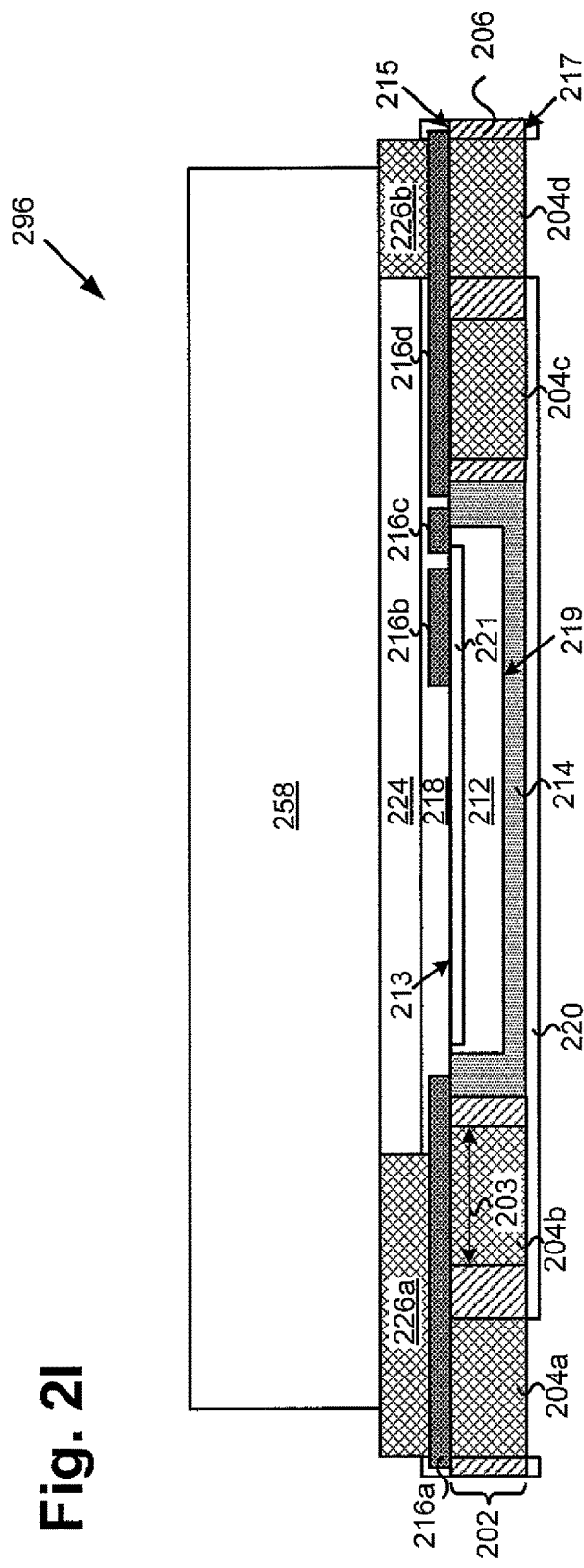

Referring to action 192 in FIG. 1 and semiconductor structure 292 in FIGS. 2G-i and 2G-ii, action 192 includes forming routing conductors on the top surface of the support substrate, the routing conductors in electrical connection with an active region of the power semiconductor die. Referring to FIG. 2G-i, semiconductor structure 292 illustrates a cross-sectional view of a portion of a power semiconductor package after completion of action 192 in flowchart 100 of FIG. 1, according to one implementation of the present disclosure. For example, semiconductor structure 292 in FIG. 2G-i is a cross-sectional view of semiconductor structure 292 along line 2G-i-2G-i in FIG. 2G-ii.

As illustrated in FIG. 2G-i, semiconductor structure 292 includes routing conductors 216a, 216b, 216c and 216c on top surface 215 of support substrate 202. Routing conductors 216a, 216b, 216c and 216c may be various portions of a metallization layer formed on top surface 215 of support substrate 202 and on top surface 213 of power semiconductor die 212 having active region 221. In one implementation, routing conductors 216a, 216b, 216c and 216c may include or may be made of a suitable metallization material such as, for example, a suitable conductor, e.g. silicon (Si), for example polycrystalline silicon or amorphous silicon, aluminum (Al), copper (Cu), carbon (C), or an alloy and/or a layer stack including one or more of the aforementioned materials. In another implementation, routing conductors 216a, 216b, 216c and 216c may include or may be made of other suitable metallization materials, such as other suitable metals or metal alloys. As illustrated in FIG. 2G-i, routing conductor 216a couples bar via 204a to bar via 204b. Routing conductor 216b is coupled to top surface 213 of power semiconductor die 212. Routing conductor 216c is also coupled to top surface 213 of power semiconductor die 212. Routing conductor 216d couples bar via 204c to bar via 204d.

FIG. 2G-ii illustrates a top plan view of a portion of semiconductor structure 292 according to one implementation of the present application. As can be seen in FIG. 2G-ii, various routing conductors, such as routing conductors 216a, 216b, 216c and 216d, are formed on top surface 215 of support substrate 202. The routing conductors are coupled to various electrode pads (not explicitly shown in FIG. 2G-ii) on top surface 213 of power semiconductor die 212. For example, routing conductor 216a is coupled to a switched node (SW) on top surface 213 of power semiconductor die 212. Routing conductor 216b is coupled to an input node (VIN) of a power stage on top surface 213 of power semiconductor die 212. Routing conductor 216c is coupled to a supply voltage node (VCC) of the power stage on top surface 213 of power semiconductor die 212. Routing conductor 216d is coupled to an output node (VOUT) of the power stage on top surface 213 of power semiconductor die 212. It should be noted that although only bar vias 204a, 204b, 204c and 204d are shown in FIG. 2G-ii, it should be understood that semiconductor structure 292 may include other bar vias in support substrate 202, where the bar vias are coupled to their respective routing conductors for routing electric signals from and to power semiconductor die 212.

Referring to action 194 in FIG. 1 and semiconductor structure 294 in FIG. 2H, action 194 includes forming passivation layers over the top surface and a bottom surface of the support substrate. Referring to FIG. 2H, semiconductor structure 294 illustrates a cross-sectional view of a portion of a power semiconductor package after completion of action 194 in flowchart 100 of FIG. 1, according to one implementation of the present disclosure. As illustrated in FIG. 2H, semiconductor structure 294 includes passivation layer 218 over top surface 215 of support substrate 202, and passivation layer 220 over bottom surface 217 of support substrate 202.

As illustrated in FIG. 2H, passivation layer 218 is disposed on at least a part of top surface 215 of support substrate 202, at least a part of top surface 213 of power semiconductor die 212, and on and between the routing conductors (e.g., routing conductors 216a, 216b, 216c and 216d). Passivation layer 218 may serve to electrically insulate portions of top surface 213 and active region 221 of power semiconductor die 212 and routing conductors 216a, 216b, 216c and 216d over top surface 215 of support substrate 202. Passivation layer 218 also includes openings, such that various routing conductors, such as routing conductors 216a and 216d, are exposed over top surface 215 of support substrate 202 for electrical connection. As illustrated in FIG. 2H, passivation layer 220 is disposed on at least a part of bottom surface 217 of support substrate 202. Passivation layer 220 may serve to electrically insulate various bar vias (e.g., bar vias 204b and 204c) on bottom surface 217 of support substrate 202. Passivation layer 220 also includes openings, such that various bar vias (e.g., bar vias 204a and 204d), are exposed on bottom surface 217 of support substrate 202 for electrical connection. In the present implementation, passivation layers 218 and 220 may include any suitable insulative material, such as silicon dioxide. In other implementations, passivation layers 218 and 220 may include other suitable dielectric material or photoresist material.

Referring to action 196 in FIG. 1 and semiconductor structure 296 in FIG. 2I, action 196 includes inverting the support substrate such that the active region of the power semiconductor die faces up, and placing an output inductor over the support substrate. Referring to FIG. 2I, semiconductor structure 296 illustrates a cross-sectional view of a portion of a power semiconductor package after completion of action 196 in flowchart 100 of FIG. 1, according to one implementation of the present disclosure. As illustrated in FIG. 2I, semiconductor structure 294 in FIG. 2H is inverted or flipped, such that top surface 215 of support substrate 202 faces up, while bottom surface 217 of support substrate 202 faces down and is configured for attachment to a printed circuit board (not explicitly shown in FIG. 2I), for example. As illustrated in FIG. 2I, semiconductor structure 296 also includes output inductor 258 placed over top surface 215 of support substrate 202. Top surface 213 and active region 221 of power semiconductor die 212 also face up toward output inductor 258. Output inductor 258 is situated on and supported by electrical connectors 226a and 226b over support substrate 202, where electrical connectors 226a and 226b are coupled to routing conductors 216a and 216d, respectively, in openings of passivation layer 218. It is noted that, in the present implementation, output inductor 258 has a smaller width than support substrate 202. In another implementation, output inductor 258 may have a width that is equal to or greater than that of support substrate 202. It is also noted that output inductor 258 and passivation layer 218 are separated by air gap 224, which can be filled with a packaging enclosure, such as a molding compound, in a subsequent action.

As illustrated in FIG. 2I, routing conductor 216a is coupled to output inductor 258 through electrical connector 226a, such as a lead. Routing conductor 216a is in turn coupled to a switched node on power semiconductor die 212. Routing conductor 216d is coupled to output inductor 258 through electrical connector 226b, such as a lead. Routing conductor 216d is in turn coupled to an output node on power semiconductor die 212. As illustrated in FIG. 2I, bar vias 204a and 204d are exposed on bottom surface 217 of support substrate 202, and configure for attachment to a printed circuit board, for example.

Referring to action 198 in FIG. 1 and semiconductor structure 298 in FIG. 2J, action 198 includes optionally molding the output inductor and the support substrate with a packaging enclosure. Referring to FIG. 2J, semiconductor structure 298 illustrates a cross-sectional view of a portion of a power semiconductor package after completion of action 198 in flowchart 100 of FIG. 1, according to one implementation of the present disclosure. As illustrated in FIG. 2J, semiconductor structure 298 includes support substrate 202 having bar vias 204a, 204b, 204c and 204d, prepreg layer 206 and power semiconductor die 212 embedded in laminating layer 214. Power semiconductor die 212 includes active region 221 on top surface 213, and is situated in laminating layer 214 on bottom surface 219 thereof. Semiconductor structure 298 also includes routing conductors 216a, 216b, 216c and 216d on top surface 215 of support substrate 202, passivation layer 220 on bottom surface 217 of support substrate 202, passivation layer 218 over top surface 215 of support substrate 202, and output inductor 258 coupled to routing conductors 216a and 216d through electrical connectors 226a and 226b, respectively. Semiconductor structure 298 includes optional packaging enclosure 230, that is configured to encapsulate output inductor 258. Packaging enclosure 230 is formed on passivation layer 218 and fills air gap 224, as shown in FIG. 2I, between passivation layer 218 and output inductor 258. Packaging enclosure 230 also covers portions of electrical connectors 226a and 226b. Packaging enclosure 230 may include any suitable substance, such as an encapsulant and/or a molding compound for providing mechanical and/or environmental protection for semiconductor structure 298. In one implementation, semiconductor structure 298 may be a semiconductor package, such as a quad-flat no-leads (QFN) package.

As illustrated in FIG. 2J, in semiconductor structure 298, such as a power semiconductor package, output inductor 258 is placed over support substrate 202. Power semiconductor die 212 having bottom surface 219 is situated on support substrate 202 in laminating layer 214, and top surface 213 having active region 221. Support substrate 202 includes bar vias 204a, 204b, 204c and 204d, prepreg layer 206, and laminating layer 214. Routing conductors 216a, 216b, 216c and 216d are in electrical connection with active region 221 on top surface 213 of power semiconductor die 212. Output inductor 258 is coupled to active region 221 on top surface 213 of support substrate 202. Output inductor 258 is a packaged component having electrical connectors 226a and 226b, such as leads, in electrical connection with active region 221 of power semiconductor die 212.

In the present implementation, bar vias 204a, 204b, 204c and 204d may have substantially the same dimensions (e.g., width, length and height). In the present implementation, width 203 is equal to or greater than 150 μm (i.e., $150*10^{-6}$ meters). In contrast to conventional power converter packaged assemblies having laser vias which are formed by making openings in a substrate using laser beams and filling conductive material in the openings, bar vias 204a, 204b, 204c and 204d are pre-formed (e.g., before prepreg layer 206 is formed in support substrate 202). Since bar vias 204a, 204b, 204c and 204d are pre-formed, bar vias 204a, 204b, 204c and 204d can each have a width of equal to or greater than 150 μm, as compared to conventional laser vias with diameters of equal to or less than 100 μm. Thus, among other advantages, bar vias 204a, 204b, 204c also enable wide connection interfaces and easy connectivity to electrical connectors or routing structures on both top and bottom contact surfaces thereof.

By allowing top surface 213 of power semiconductor die 212 to face upward, electrodes coupled to active region 221 near top surface 213 of power semiconductor die 212 can positioned closer to output inductor 258, as compared to conventional power converter packaged assemblies where active regions of semiconductor dies are placed face down. Thus, the routing distance between a power stage in power semiconductor die 212 and output inductor 258 can be substantially reduced, thereby reducing parasitic inductance and capacitance. As bottom surface 219 of power semiconductor die 212 is situated on and supported by laminating layer 214 of support substrate 202, support substrate 202 can provide enhanced mechanical support to hold power semiconductor die 212 in place.

Also, laminating layer 214 can provide excellent thermal conductivity to transfer heat away from power semiconductor die 212 at bottom surface 217 of support substrate 202, thereby providing enhanced thermal dissipation for the semiconductor package. Moreover, as bottom surface 217 of support substrate 202 faces down and as bar vias (e.g., bar vias 204a and 204b) being exposed on bottom surface 217, semiconductor structure 298, such as a semiconductor package, can be surface mounted to a substrate, such as a printed circuit board.

Figure 3:
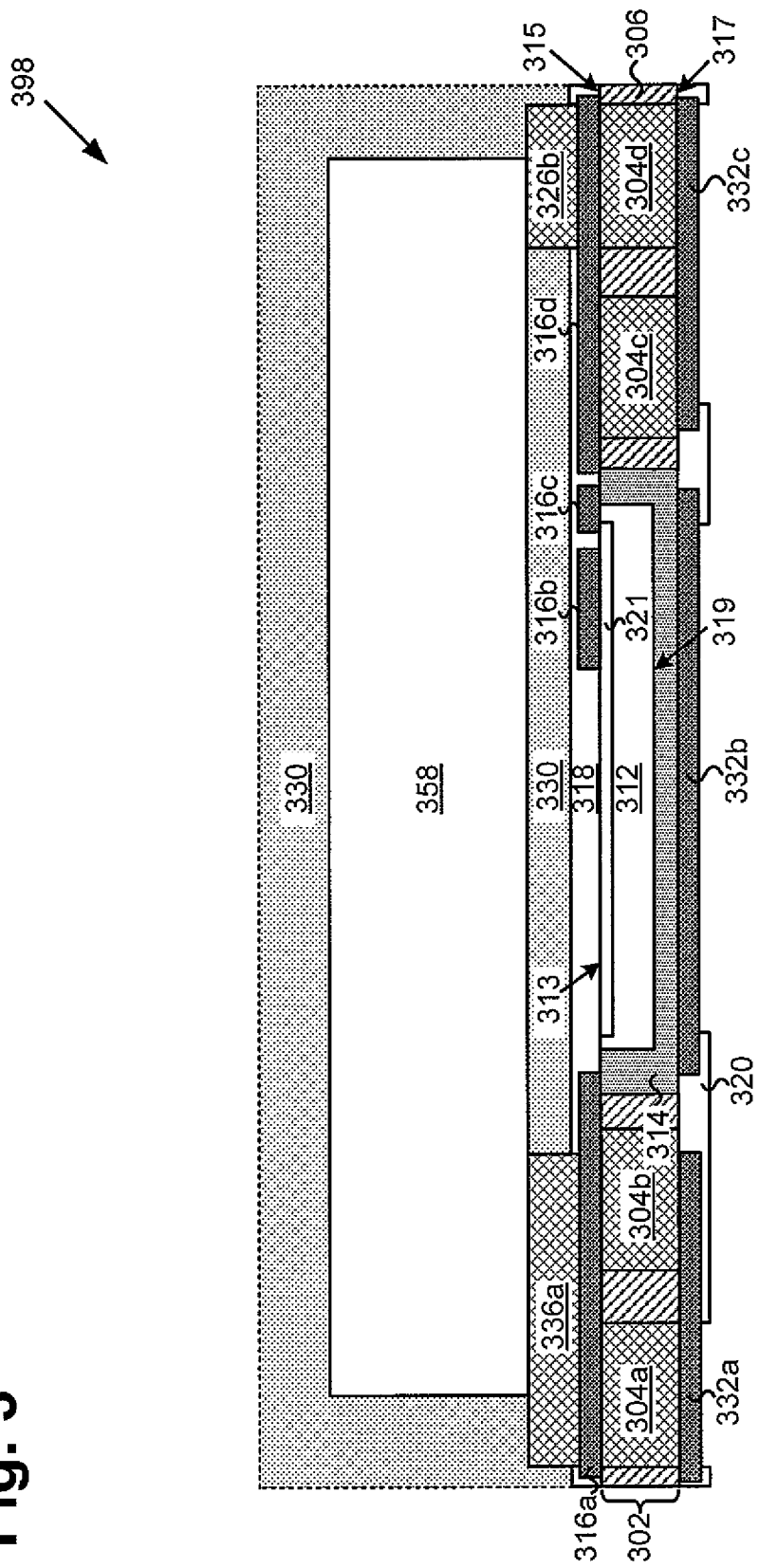
FIG. 3 illustrates a cross-sectional view of a portion of a power semiconductor package in accordance with one implementation of the present application.

Referring to FIG. 3, FIG. 3 illustrates a cross-sectional view of a portion of a power semiconductor package in accordance with one implementation of the present application. With similar numerals representing similar features in semiconductor structure 298 in FIG. 2J, semiconductor structure 398 includes support substrate 302 having bar vias 304a, 304b, 304c and 304d, prepreg layer 306 and power semiconductor die 312 embedded in laminating layer 314. Power semiconductor die 312 includes active region 321 on or near top surface 313, and is situated in laminating layer 314 on bottom surface 319 thereof. Semiconductor structure 398 also includes routing conductors 316a, 316b, 316c and 316d on top surface 315 of support substrate 302, passivation layer 320 on bottom surface 317 of support substrate 302, passivation layer 318 over top surface 315 of support substrate 302, and output inductor 358 coupled to routing conductors 316a and 316d through electrical connectors 326a and 326b, respectively. Output inductor 358 is situated on and supported by electrical connectors 326a and 326b over support substrate 302, where electrical connectors 326a and 326b are coupled to routing conductors 316a and 316d, respectively, in openings of passivation layer 318. It is noted that, in the present implementation, output inductor 358 has a smaller width than support substrate 302. In another implementation, output inductor 358 may have a width that is equal to or greater than that of support substrate 302.

Semiconductor structure 398 includes optional packaging enclosure 330, that is configured to encapsulate output inductor 358. Packaging enclosure 330 is formed on passivation layer 318 and fills the air gap between passivation layer 318 and output inductor 358. Packaging enclosure 330 also covers portions of electrical connectors 326a and 326b. Packaging enclosure 330 may include any suitable substance, such as an encapsulant and/or a molding compound for providing mechanical and/or environmental protection for semiconductor structure 398.

Semiconductor structure 398 also includes routing conductors 332a, 332b and 332c on bottom surface 317 of support substrate 302, and are configured to be surface mounted to a printed circuit board, for example. As illustrated in FIG. 3, routing conductor 332a is coupled to bar vias 304a and 304b, while routing conductor 332b is coupled to bar vias 304c and 304d. Routing conductors 332a, 332b and 332c are passivated by passivation layer 320, where portions of routing conductors 332a, 332b and 332c are exposed in respective openings in passivation layer 320 for surface attachment. Routing conductors 332a, 332b and 332c on bottom surface 317 of support substrate 302 further increase the mountable surface area at the bottom of support substrate 302, thereby making semiconductor structure 398 easy for attachment, for example, to a printed circuit board.

Figure 4:
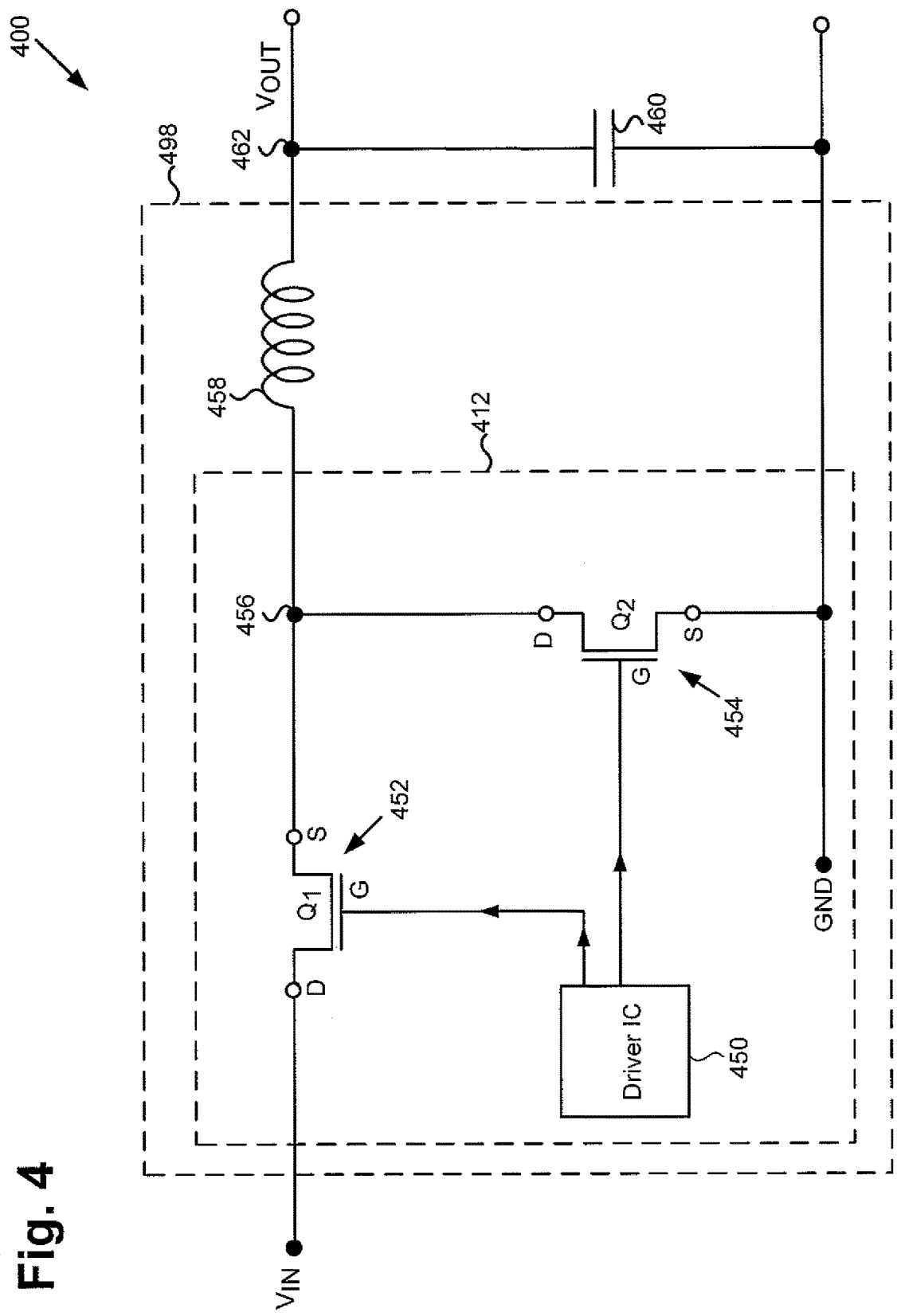
FIG. 4 illustrates a diagram of an exemplary circuit suitable for use as a power converter, according to one implementation of the present disclosure.

Referring to FIG. 4, FIG. 4 illustrates a diagram of an exemplary circuit suitable for use as a power converter, according to one implementation of the present disclosure. Power converter circuit 400 includes power converter 498 and output capacitor 460. Power converter 498 includes power stage 412 and output inductor 458. As shown in FIG. 4, power stage 412 includes high side or control transistor 452 ($Q_1$) coupled to low side or sync transistor 454 ($Q_2$) at switched node 456, as well as pulse-width modulation (PWM) control and driver 450 coupled to control transistor 452 and sync transistor 454. It is noted that PWM control and driver 450 may be implemented as a PWM and control driver IC, and is configured to provide drive signals to the respective gates of control transistor 452 and sync transistor 454. As further shown in FIG. 4, power converter circuit 400 is configured to receive an input voltage $V_{IN}$, and to provide a converted voltage, e.g., a rectified and/or stepped down voltage, as $V_{OUT}$ at output node 462.

In the present implementation, control transistor 452 and sync transistor 454 of power stage 412 may take the form of metal-oxide-semiconductor field-effect transistors (MOSFETs) configured as a half-bridge, for example. That is to say, control transistor 452 may be coupled to sync transistor 454 at switched node 456, which, in turn, may be coupled to output node 462 through output inductor 458. In some implementations, control transistor 452 and sync transistor 454 may be implemented as group IV based power transistors, such as silicon power MOSFETs having a vertical or lateral design, for example. In other implementations, control transistor 452 and sync transistor 454 may be implemented as field-effect transistors (FETs), insulated gate bipolar transistors (IGBTs), or high electron mobility transistors (HEMTs), for example. In general, control transistor 452 and sync transistor 454 may be implemented as group IV power transistors, such as silicon power transistors, or as group III-V power transistors, such as gallium nitride (GaN) power transistors. In some implementations, it may be advantageous or desirable for at least one of control transistor 452 and sync transistor 454 to be implemented as a group III-V power transistor, such as a GaN power transistor, for example. Power converter circuit 400 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

It should be noted with reference to the drawings of the present application that implementations of the present disclosure are described with respect to a power stage and an output inductor within a power semiconductor package, such as power semiconductor die 212 and output inductor 258, respectively, in semiconductor structure 298 in FIG. 2J, and power semiconductor die 312 and output inductor 358, respectively, in semiconductor structure 398 in FIG. 3. For example, power stage 412 and output inductor 458 in power converter 498 in FIG. 4 may correspond to power semiconductor die 212 and output inductor 258, respectively, in semiconductor structure 298 in FIG. 2J. Power stage 412 and output inductor 458 in power converter 498 in FIG. 4 may also correspond to power semiconductor die 312 and output inductor 358, respectively, in semiconductor structure 398. in FIG. 3.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor package comprising:
an output inductor situated over a support substrate; and
a power semiconductor die having a bottom surface situated on said support substrate, and a top surface having an active region;
wherein said output inductor is coupled to said active region on said top surface of said support substrate, wherein said support substrate comprises a plurality of bar vias, and wherein said output inductor is a packaged component having at least two leads in electrical connection with said active region of said power semiconductor die.

2. The power semiconductor package of claim 1, wherein said support substrate further comprises routing conductors in electrical connection with said active region of said power semiconductor die.

3. The semiconductor package of claim 1 wherein said power semiconductor die comprises a control transistor and a sync transistor connected in a half-bridge.

4. The semiconductor package of claim 3 wherein said output inductor has at least one lead coupled to a switched node of said half-bridge.

5. The semiconductor package of claim 3 wherein at least one of said control transistor and said sync transistor comprises a group III-V transistor.

6. The semiconductor package of claim 3 wherein at least one of said control transistor and said sync transistor comprises a group IV transistor.

7. The semiconductor package of claim 3 wherein said control transistor and said sync transistor are monolithically integrated on said power semiconductor die.

8. The semiconductor package of claim 1 wherein said power semiconductor die comprises a driver IC coupled to a control transistor and a sync transistor.

9. The semiconductor package of claim 1 wherein said support substrate and said output inductor are encapsulated in a molding compound.

10. A method of forming a power semiconductor package, said method comprising:
forming a support substrate having a plurality of bar vias;
forming a power semiconductor die on said support substrate, said power semiconductor die having a bottom surface situated on said support substrate, and a top surface having an active region; and
placing an output inductor over said support substrate;
wherein said output inductor is coupled to said active region on said top surface of said support substrate, and wherein said power semiconductor die comprises a control transistor and a sync transistor connected in a half-bridge.

11. The method of claim 10 wherein said output inductor is a packaged component having at least two leads in electrical connection with said active region of said power semiconductor die.

12. The method of claim 10 further comprising forming routing conductors in electrical connection with said active region of said power semiconductor die.

13. The method of claim 10 further comprising forming at least one photoresist layer on said support substrate.

14. The method of claim 10 further comprising molding said output inductor and said support substrate using a molding compound.

15. The method of claim 10 wherein at least one of said control transistor and said sync transistor comprises a group transistor.

16. The method of claim 10 wherein at least one of said control transistor and said sync transistor comprises a group IV transistor.

17. The method of claim 10 wherein said control transistor and said sync transistor are monolithically integrated on said power semiconductor die.

18. The method of claim 10 wherein said power semiconductor die comprises a driver IC coupled to said control transistor and said sync transistor.

19. A power semiconductor package comprising:
an output inductor situated over a support substrate; and
a power semiconductor die having a bottom surface situated on said support substrate, and a top surface having an active region;
wherein said output inductor is coupled to said active region on said top surface of said support substrate, wherein said support substrate comprises a plurality of bar vias, and wherein said power semiconductor die comprises a control transistor and a sync transistor connected in a half-bridge.

* * * * *

UNITED STATES PATENT AND TRADEMARK OFFICE
CERTIFICATE OF CORRECTION

| | |
|---|---|
| PATENT NO. | : 9,640,474 B1 |
| APPLICATION NO. | : 15/052520 |
| DATED | : May 2, 2017 |
| INVENTOR(S) | : Eung San Cho and Danny Clavette |

It is certified that error appears in the above-identified patent and that said Letters Patent is hereby corrected as shown below:

In the Claims

Column 12, Line 45-46, Claim 15: Replace "..sync transistor comprises a group transistor." with
-- sync transistor comprises a group III-V transistor. --

Signed and Sealed this
Twenty-ninth Day of August, 2017

Joseph Matal
*Performing the Functions and Duties of the
Under Secretary of Commerce for Intellectual Property and
Director of the United States Patent and Trademark Office*